US012756119B1

(12) United States Patent
Huang et al.

(10) Patent No.: US 12,756,119 B1
(45) Date of Patent: Oct. 6, 2026

(54) GROUND CONNECTION FOR AUTOMOTIVE SHIELDED CABLES

(71) Applicant: Infineon Technologies Americas Corp., El Segundo, CA (US)

(72) Inventors: Shaowu Huang, Los Altos, CA (US); Dance Wu, Palo Alto, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 191 days.

(21) Appl. No.: 18/889,437

(22) Filed: Sep. 19, 2024

Related U.S. Application Data

(60) Provisional application No. 63/539,585, filed on Sep. 20, 2023.

(51) Int. Cl.
*H05K 1/02* (2006.01)
*H01R 12/53* (2011.01)
*H05K 3/32* (2006.01)

(52) U.S. Cl.
CPC ........... *H01R 12/53* (2013.01); *H05K 1/0231* (2013.01); *H05K 1/0237* (2013.01); *H05K 3/32* (2013.01); *H05K 2201/10356* (2013.01)

(58) Field of Classification Search
CPC .... H01R 12/53; H05K 1/0231; H05K 1/0237; H05K 3/32; H05K 2201/10356
USPC .......................................................... 361/782
See application file for complete search history.

(56) References Cited

U.S. PATENT DOCUMENTS

| | | | | |
|---|---|---|---|---|
| 11,395,401 | B1 * | 7/2022 | Huang | H05K 1/0227 |
| 2019/0223287 | A1 * | 7/2019 | Nishida | H05K 5/0069 |

OTHER PUBLICATIONS

DLW21SH900HQ2#, Murata Manufacturing Co. Ltd., Product Search Data Sheet, pp. 1-3, as downloaded from https://www.murata.com/.

* cited by examiner

*Primary Examiner* — Binh B Tran

(57) ABSTRACT

An Ethernet MDI device includes a cable interface, disposed on a circuit board and configured to connect to a cable having (i) conductors and (ii) an EMI shield. A cable-ground metal region is disposed on the circuit board and electrically connects to the shield of the cable. A digital-ground metal region is disposed on the circuit board and electrically connects to electronic circuitry mounted on the circuit board. A discontinuity on the circuit board to electrically separates the cable-ground metal region from the digital-ground metal region. First capacitors are mounted across the discontinuity. The first capacitors have first capacitances and are configured to reduce EMI in a first frequency range. Second capacitors are mounted across the discontinuity. The second capacitors have second capacitances higher than the first capacitances, and are configured to reduce EMI in a second frequency range that is at least partially below the first frequency range.

20 Claims, 3 Drawing Sheets

GROUND CONNECTION FOR AUTOMOTIVE SHIELDED CABLES

CROSS-REFERENCE TO RELATED APPLICATIONS

This application claims the benefit of U.S. Provisional Patent Application 63/539,585, filed Sep. 20, 2023, whose disclosure is incorporated herein by reference.

FIELD OF THE DISCLOSURE

The present relates generally to communication devices in automotive data networks, and particularly to ground connection schemes providing improved Electro-Magnetic Compatibility (EMC) performance.

BACKGROUND

The automotive environment is characterized by high levels of electromagnetic noise over a broad spectrum. This noise is challenging for automotive data networks, which are required to perform continuously and reliably, e.g., to meet driver safety requirements.

One of the factors that impact the EMC performance of an automotive communication device is its ground connection scheme. Some communication devices use Direct Current (DC) grounding, while other devices use Alternating Current (AC) grounding. Each of these grounding schemes has its own advantages and disadvantages.

The description above is presented as a general overview of related art in this field and should not be construed as an admission that any of the information it contains constitutes prior art against the present patent application.

SUMMARY

An embodiment that is described herein provides an Ethernet Media-Dependent Interface (MDI) device including a cable interface, which is disposed on a circuit board and is configured to connect to a cable having (i) conductors and (ii) an Electro-Magnetic Interference (EMI) shield surrounding the conductors. A cable-ground metal region is disposed on the circuit board and is electrically connected to the shield of the cable. A digital-ground metal region is disposed on the circuit board and is electrically connected to electronic circuitry mounted on the circuit board. A discontinuity on the circuit board is configured to electrically separate the cable-ground metal region from the digital-ground metal region. A plurality of first capacitors is mounted across the discontinuity. The first capacitors have first capacitances and are configured to reduce EMI in a first frequency range. Two or more second capacitors are mounted across the discontinuity. The second capacitors have second capacitances higher than the first capacitances. The second capacitors are configured to reduce EMI in a second frequency range that is at least partially below the first frequency range.

In some embodiments, the Ethernet MDI device further includes circuit traces disposed on the circuit board and configured to connect the conductors of the cable to the electronic circuitry. In an example embodiment, the circuit traces cross the discontinuity in a defined crossing location, and the first capacitors are distributed along the discontinuity, symmetrically with respect to the crossing location. In an embodiment, the first capacitors are mounted outside the crossing location. In a disclosed embodiment, the circuit traces cross the discontinuity in a defined crossing location, and the second capacitors are positioned over the discontinuity symmetrically with respect to the crossing location.

In some embodiments, the circuit traces include microstrip traces. In other embodiments, the circuit traces include strip-line traces.

In an embodiment, the Ethernet MDI device further includes (i) a power-ground metal region disposed on the circuit board and connected to a power source, the power-ground metal region being electrically separate from the cable-ground metal region and from the digital-ground metal region, and (ii) one or more inductors configured to connect the power-ground metal region to one or both of the cable-ground metal region and the digital-ground metal region.

In an embodiment, the second capacitors are mounted on a single surface of the circuit board. In an alternative embodiment, the second capacitors are mounted on both surfaces of the circuit board.

There is additionally provided, in accordance with an embodiment that is described herein, a method of manufacturing an Ethernet: Media-Dependent Interface (MDI) device. The method includes disposing a cable interface on a circuit board, for connecting to a cable having (i) conductors and (ii) an Electro-Magnetic Interference (EMI) shield surrounding the conductors. Also disposed on the circuit board are (i) a cable-ground metal region for electrically connecting to the shield of the cable, and (ii) a digital-ground metal region that is electrically connected to electronic circuitry mounted on the circuit board, while creating on the circuit board a discontinuity that electrically separates the cable-ground metal region from the digital-ground metal region. A plurality of first capacitors is mounted across the discontinuity. The first capacitors have first capacitances and are configured to reduce EMI in a first frequency range. Two r more second capacitors are mounted across the discontinuity. The second capacitors have second capacitances higher than the first capacitances. The second capacitors are configured to reduce EMI in a second frequency range that is at least partially below the first frequency range.

The present disclosure will be more fully understood from the following detailed description of the embodiments thereof, taken together with the drawings in which:

DETAILED DESCRIPTION OF EMBODIMENTS

Figure 1:
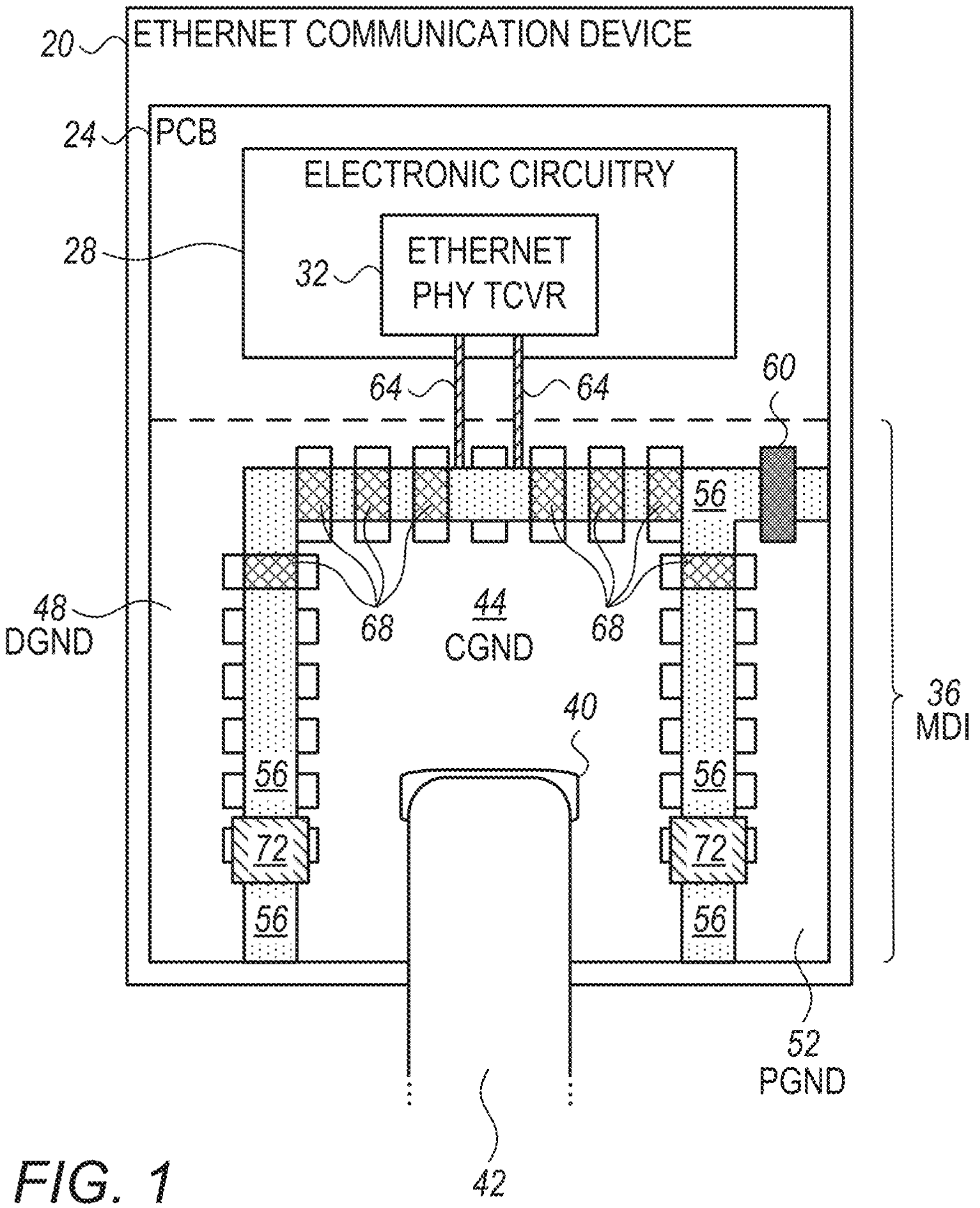
FIG. 1 is a diagram that schematically illustrates an automotive Ethernet communication device comprising a Media-Dependent Interface (MDI) having improved ground connection, in accordance with an embodiment that is described herein.

An Ethernet communication device typically comprises a Media-Dependent Interface (MDI)—an analog circuit that forms the physical interface between the communication device and the Ethernet cable.

The MDI is highly sensitive to Electro-Magnetic Interference (EMI), including both Radiated Emission (RE) and Radiation Immunity (RI). The design of the MDI's grounding has a considerable impact on the EMC performance of the MDI, and of the Ethernet communication device as a whole. The grounding scheme typically is required to perform well over a wide frequency range. In multi-gigabit-per-second ("multi-gig") devices, for example, the applicable frequency range is between tens of KHz to several GHz.

Embodiments that are described herein provide MDI designs with grounding schemes that exhibit high EMI suppression over a wide frequency range.

In some embodiments, an Ethernet MDI comprises a cable interface disposed on a circuit board, and circuit traces that traverse the circuit board and connect the cable interface to electronic circuitry of the communication device, e.g., to a physical layer (PHY) transceiver. In the examples described herein, the cable interface connects to a Shielded Twisted Pair (STP) cable having a pair of conductors surrounded by an EMI shield. The cable interface may comprise, for example, a connector or a set of pads.

In some embodiments, the MDI further comprises a metallic ground layer that is divided into multiple metal regions, referred to as a cable-ground (CGND) region, a digital-ground (DGND) region and a power-ground (PGND) region. The CGND region is located in the vicinity of the cable interface and connected to the shield of the cable. The DGND region is located further away from the cable interface and electrically connected to the ground of the electronic circuitry. The PGND region, used in some designs, is electrically connected to a power ground of the communication device. The different ground regions are electrically separated from one another by a discontinuity (e.g., gap or slot) on the surface of the circuit board.

To provide high-performance grounding over a wide spectral range, the MDI comprises two sets of capacitors that are mounted across the discontinuity between the CGND region and the DGND region. A first set of capacitors, referred to as "small capacitors", has a total capacitance on the order of 0.1-10 μF, configured to reduce EMI in a high frequency range, e.g., from several MHz to several GHz. A second set of capacitors, referred to as "large capacitors", has a total capacitance on the order of 10 μF-200 μF, configured to reduce EMI in a low frequency range, e.g., from several KHz to 20 MHz.

The capacitance values and frequency ranges given above are chosen purely by way of example. Any other suitable capacitance values and frequency ranges can be used in alternative embodiments. In some embodiments, as in the example above, the high and low frequency ranges may have some overlap. Generally put, the lower frequency range is at least partially below the high frequency range.

Various MDI designs are described herein. The location at which the circuit traces cross the discontinuity (referred to as "crossing location") typically serves as a center of symmetry of the MDI. The small capacitors are typically placed in close proximity to the crossing location, although not directly over it. The large capacitors may be placed further away from the crossing location. Both the small capacitors and the large capacitors typically are distributed symmetrically with respect to the crossing location.

In some embodiments the grounding scheme is one-sided. In these embodiments, a CGND region, a DGND region and a discontinuity are disposed only on one surface of the circuit board. In other embodiments the grounding scheme is two-sided, i.e., both surfaces of the circuit board have respective CGND regions, DGND regions and discontinuities. The small capacitors and large capacitors may be placed on one surface or on both surfaces. Various geometrical layouts can be used for the CGND region, the DGND region and the discontinuity.

Example test results that demonstrate the EMC performance of various disclosed MDI configurations are provided in U.S. Provisional Patent Application 63/539,585, cited above. In brief, and large capacitors determine EMC performance over high and low frequency ranges, respectively. Symmetricity and proximity of capacitor placements with respect to the crossing location are important for EMC performance over the high frequency range, with better symmetricity and/or better proximity resulting in better EMC performance.

FIG. 1 is a diagram that schematically illustrates an automotive Ethernet communication device 20, in accordance with an embodiment that is described herein. Communication device 20 can be used, for example, for connecting a sensor (such as camera, radar, lidar, temperature, audio and the like) or Electronic Control Unit (ECU) installed in a vehicle to the vehicle's Ethernet network.

Communication device 20 is assembled on a circuit board, in the present example a dual-layer or multi-layer Printed Circuit Board (PCB) 24. Communication device 20 comprises electronic circuitry 28 disposed on PCB 24. Circuitry 28 may comprise any suitable circuitry, e.g., an Ethernet PHY transceiver 32.

Communication device 20 further comprises an MDI 36 disposed on PCB 24. MDI 36 is used for connecting communication device 20 to an Ethernet cable 42. In the present example, cable 42 is a Shielded Twisted Pair (STP) cable comprising a pair of conductors and an EMI shield. Alternatively, any other suitable cable type can be used. A cable interface 40 is disposed on PCB 24 for connecting to cable 42. Cable interface 40 may comprise, for example, a connector (which connects to a mating connector on cable 42) or a set of PCB pads (for direct soldering to the conductors and the shield of cable 42).

A pair of circuit traces 64 are formed in PCB 24, typically in an internal metal layer. At one end, traces 64 are electrically connected to the pair of conductors of cable 42 (via cable interface 40). At the other end, traces 64 are electrically connected to electronic circuitry 28, e.g., to Ethernet transceiver 32. Traces 64 are used for conveying Ethernet signals between transceiver 32 and cable 42.

The top surface PCB 24, seen in the figure, has a metal layer disposed thereon. The metal layer is divided into several separate ground regions, namely a cable-ground (CGND) region 44, a digital-ground (DGND) region 48 and a power-ground (PGND) region 52.

CGND region 44 occupies the vicinity of cable interface 40, and is electrically connected to the EMI shield of cable 42. DGND region 48 is located further away from cable interface 40, towards electronic circuitry 28, and is electrically connected to the digital ground of the electronic circuitry. PGND region 52 is electrically connected to a separate power ground of a power supply of communication device 20. A discontinuity 56 on the surface of PCB is used for electrically isolating between CGND region 44, DGND region 48 and PGND region 52. Discontinuity 56 may be formed, for example, by etching or otherwise removing part of the top metal layer so as to create a gap between the different ground regions.

In an example embodiment, the size of CGND region 44 is approximately 15-by-15 millimeters for accommodating the mounting of a SMT connector. A typical width of discontinuity 56 is 0.5 to 1 millimeter. Alternatively, any other suitable sizes can be used.

An inductor 60 is mounted across discontinuity 56 to connect between DGND region 48 and PGND region 52. In some embodiments inductor 60 is a Common-Mode Choke (CMC). In alternative embodiments, any other suitable type of inductor can be used. In other embodiments, PGND and DGND are merged into a single DGND, such that there is no discontinuity between PGDN and DGND, thereby obviating the need for inductor 60.

In the embodiment of FIG. 1, MDI 36 further comprises two sets of capacitors—A first set of "small capacitors" 68; and a second set of "large capacitors" 72. Both small capacitors 68 and large capacitors 72 are mounted across discontinuity 56 between CGND region 44 and DGND region 48.

In the present example, the first set of capacitors comprises eight small capacitors 68, and the second set of capacitors comprises two large capacitors 72. In some implementations, sixteen small capacitors 68 are used. In some implementations, four large capacitors 72 are used. Alternatively, any other suitable numbers of capacitors can be used in either set. Typically, the number of small capacitors 68 is higher than the number of large capacitors 72.

In the present embodiment, the total capacitance (the sum of capacitances) of small capacitors 68 is on the order of 0.1-10 μF, and the total capacitance of large capacitors 72 is on the order of 10-200 μF. With these capacitance values, small capacitors 68 provide high EMI suppression in a high frequency range (e.g., from 1 MHz to several GHz), and large capacitors 72 provide high EMI suppression in a low frequency range, e.g., from several KHz to 20 MHz.

The example configuration of FIG. 1 demonstrates several design principles that are important for achieving high EMI suppression. For example, as seen, small capacitors 68 are placed in close proximity to (but outside of) the crossing location (the location at which circuit traces 64 cross discontinuity 56). Large capacitors 72 are placed further away from the crossing location along discontinuity 56. Both small capacitors 68 and large capacitors 72 are placed symmetrically with respect to the crossing location. To achieve this symmetry, the number of small capacitors 68 is even, and the number of large capacitors is also even.

The configuration of MDI 36 seen in FIG. 1 is an example configuration that was chosen solely for the sake of conceptual clarity. In alternative embodiments, any other suitable configuration can be used.

For example, the number of small capacitors 68 and the number of large capacitors 72 may differ from the numbers seen in FIG. 1. Small capacitors 68 and large capacitors 72 may be distributed in any suitable manner along discontinuity 56 between CGND 44 and DGND 48.

As another example, the configuration of FIG. 1 is one-sided, in the sense that CGND region 44, DGND region 48 and discontinuity 56 are formed only on one surface of PCB 24. In alternative embodiments, the grounding scheme is two-sided (not seen), i.e., corresponding CGND regions 44, DGND regions 48 and discontinuities 56 are formed on both opposite surfaces of the PCB. In such embodiments, the two CGND regions 44 on opposite surfaces are typically connected to one another using conductive vias traversing PCB 24. Similarly, the two DGND regions 48 typically are connected to one another using conductive vias that traverse the PCB.

In some embodiments, circuit traces 64 are implemented as strip-line transmission lines. In other embodiments, circuit traces 64 are implemented as micro-strip-line transmission lines.

In the example of FIG. 1, small capacitors 68 and large capacitors 72 are mounted on a single surface of PCB 24. In alternative embodiments, when using a two-sided configuration, small capacitors 68 and large capacitors 72 can be divided between the two opposite surface of the PCB in any suitable way. For example, small capacitors 68 may be mounted on one surface and large capacitors 72 on the other surface. As another example, a subset (e.g., half) of small capacitors 68 and a subset (e.g., half) of large capacitors 72 may be mounted on one surface of PCB 24, and the remaining small capacitors and large capacitors on the other surface.

In some embodiments, device 20 may not have a separate power ground (or, in other words, the power ground is the same as the digital ground), in which case PGND region 52 and inductor 60 are omitted.

In some embodiments, an additional inductor (e.g., CMC, not seen in the figure) may be mounted across discontinuity 56 between CGND 44 and DGND 48. The additional inductor may be mounted, for example, over the crossing location (the location at which traces 64 cross discontinuity 56).

Figure 2A:
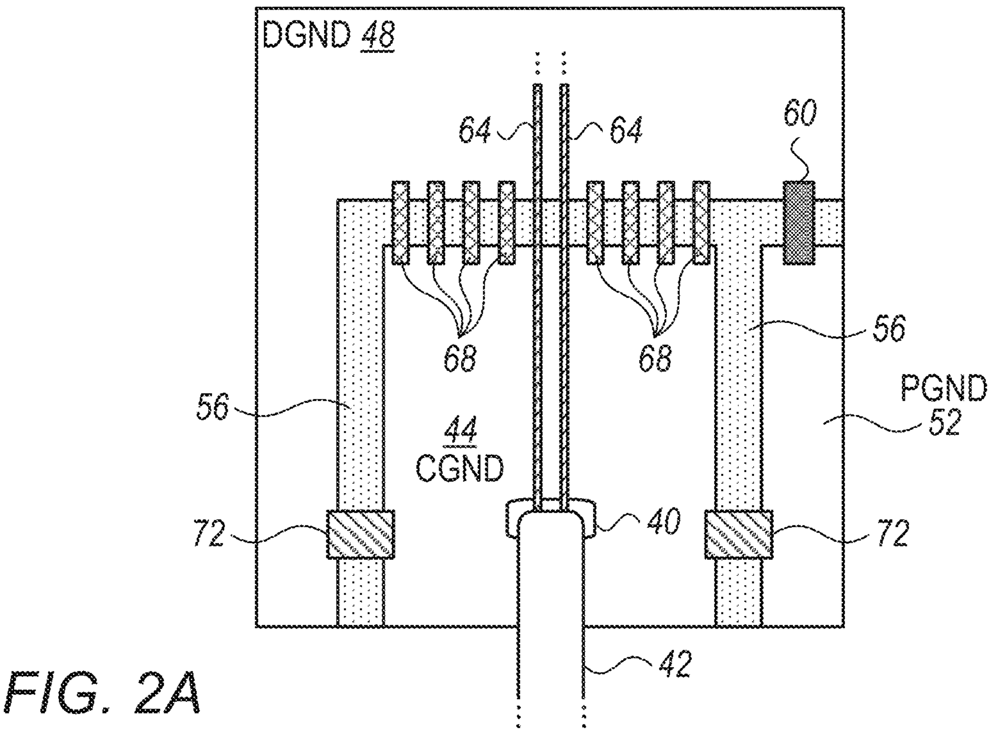
FIGS. 2A, 2B and 3 are diagrams that schematically illustrate MDIs having improved ground connections, in accordance with alternative embodiments that are described herein.
Figure 2B:
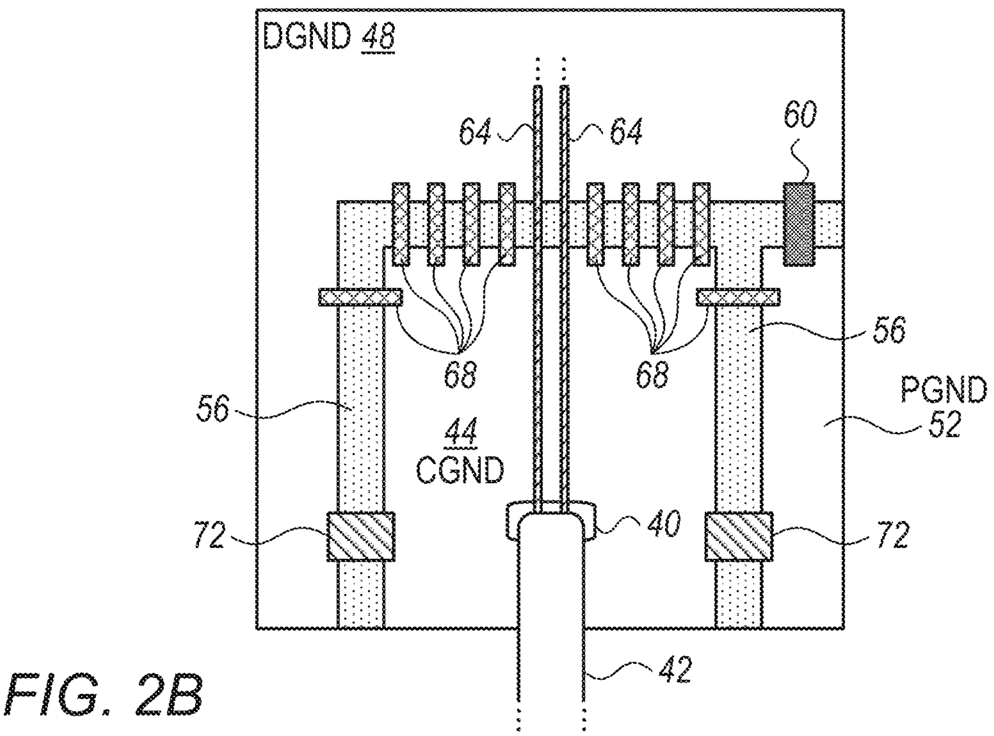

FIGS. 2A and 2B are diagrams that schematically illustrate MDIs having improved ground connections, in accordance with alternative embodiments that are described herein. In both figures, discontinuity 56 has three sides. In FIG. 2A, small capacitors 68 are all placed along one side of discontinuity 56. In FIG. 2B, small capacitors 68 are distributed over all three sides of the discontinuity.

Figure 3:
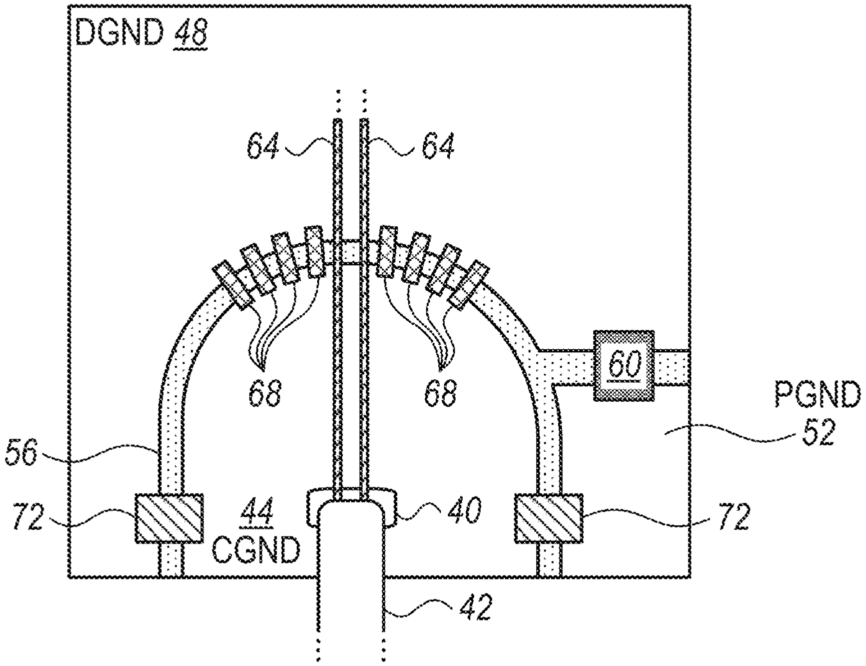

FIG. 3 is a diagram that schematically illustrates an MDI having improved ground connections, in accordance with another embodiment that is described herein. In this example, discontinuity 56 is U-shaped, and small capacitors 68 are placed along the curved section of the U-shaped discontinuity. Further alternatively, discontinuity 56 may have any other suitable shape.

Figure 4:
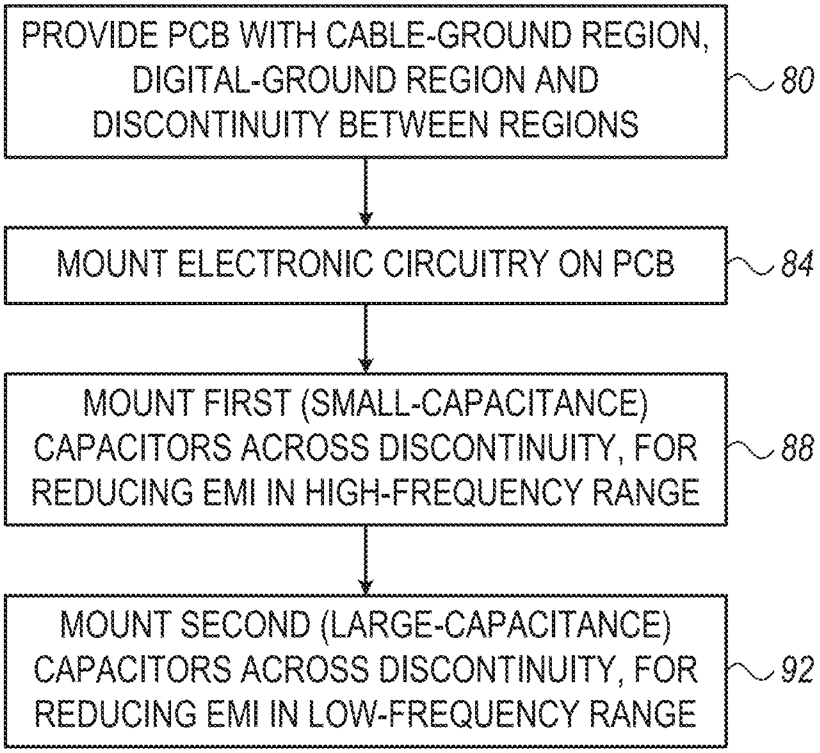
FIG. 4 is a flow chart that schematically illustrates a method for fabricating an automotive Ethernet communication device, in accordance with an embodiment that is described herein.

FIG. 4 is a flow chart that schematically illustrates a method for fabricating an automotive Ethernet communication device, in accordance with an embodiment that is described herein.

The method begins by providing a circuit board, in the present example PCB 24 of FIG. 1, at a circuit board provisioning stage 80. The PCB has at least a CGND metal region 44 and a DGND metal region 48 disposed thereon, with a discontinuity 56 between the two regions.

At a circuitry mounting stage 84, electronic circuitry 28 is mounted on PCB 24. At a small capacitor mounting stage 88, small capacitors 68 are mounted across discontinuity 56. At a large capacitor mounting stage 92, large capacitors 72 are mounted across discontinuity 56.

Although the embodiments described herein mainly address automotive Ethernet systems, the methods and systems described herein can also be used in other applications, such as in any other computer and electronic systems that employ AC grounding schemes and shielded copper cable channels.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Ethernet Media-Dependent Interface (MDI) device, comprising:

a cable interface, which is disposed on a circuit board and is configured to connect to a cable having (i) conductors and (ii) an Electro-Magnetic Interference (EMI) shield surrounding the conductors;

a cable-ground metal region, which is disposed on the circuit board and is electrically connected to the shield of the cable;

a digital-ground metal region, which is disposed on the circuit board and is electrically connected to electronic circuitry mounted on the circuit board;

a discontinuity on the circuit board, configured to electrically separate the cable-ground metal region from the digital-ground metal region;

a plurality of first capacitors mounted across the discontinuity, the first capacitors having first capacitances and being configured to reduce EMI in a first frequency range; and two or more second capacitors mounted across the discontinuity, the second capacitors having second capacitances higher than the first capacitances, the second capacitors being configured to reduce EMI in a second frequency range that is at least partially below the first frequency range.

2. The Ethernet MDI device according to claim 1, further comprising circuit traces disposed on the circuit board and configured to connect the conductors of the cable to the electronic circuitry.

3. The Ethernet MDI device according to claim 2, wherein:

the circuit traces cross the discontinuity in a defined crossing location; and the first capacitors are distributed along the discontinuity, symmetrically with respect to the crossing location.

4. The Ethernet MDI device according to claim 3, wherein the first capacitors are mounted outside the crossing location.

5. The Ethernet MDI device according to claim 2, wherein:

the circuit traces cross the discontinuity in a defined crossing location; and the second capacitors are positioned over the discontinuity symmetrically with respect to the crossing location.

6. The Ethernet MDI device according to claim 2, wherein the circuit traces comprise microstrip traces.

7. The Ethernet MDI device according to claim 2, wherein the circuit traces comprise strip-line traces.

8. The Ethernet MDI device according to claim 1, further comprising:

a power-ground metal region disposed on the circuit board and connected to a power source, the power-ground metal region being electrically separate from the cable-ground metal region and from the digital-ground metal region; and one or more inductors configured to connect the power-ground metal region to one or both of the cable-ground metal region and the digital-ground metal region.

9. The Ethernet MDI device according to claim 1, wherein the second capacitors are mounted on a single surface of the circuit board.

10. The Ethernet MDI device according to claim 1, wherein the second capacitors are mounted on both surfaces of the circuit board.

11. A method of manufacturing an Ethernet Media-Dependent Interface (MDI) device, the method comprising:

disposing a cable interface on a circuit board, for connecting to a cable having (i) conductors and (ii) an Electro-Magnetic Interference (EMI) shield surrounding the conductors;

disposing on the circuit board (i) a cable-ground metal region for electrically connecting to the shield of the cable, and (ii) a digital-ground metal region that is electrically connected to electronic circuitry mounted on the circuit board, while creating on the circuit board a discontinuity that electrically separates the cable-ground metal region from the digital-ground metal region;

mounting a plurality of first capacitors across the discontinuity, the first capacitors having first capacitances and being configured to reduce EMI in a first frequency range; and mounting two or more second capacitors across the discontinuity, the second capacitors having second capacitances higher than the first capacitances, the second capacitors being configured to reduce EMI in a second frequency range that is at least partially below the first frequency range.

12. The method of manufacturing an Ethernet MDI device according to claim 11, further comprising disposing circuit traces on the circuit board, to connect the conductors of the cable to the electronic circuitry.

13. The method of manufacturing an Ethernet MDI device according to claim 12, wherein mounting the first capacitors comprises distributing the first capacitors along the discontinuity, symmetrically with respect to a crossing location at which the circuit traces cross the discontinuity.

14. The method of manufacturing an Ethernet MDI device according to claim 13, wherein mounting the first capacitors comprises locating the first capacitors outside the crossing location.

15. The method of manufacturing an Ethernet MDI device according to claim 12, wherein mounting the second capacitors comprises positioning the second capacitors over the discontinuity symmetrically with respect to a crossing location at which traces the circuit cross the discontinuity.

16. The method of manufacturing an Ethernet MDI device according to claim 12, wherein disposing the circuit traces comprises disposing microstrip traces.

17. The method of manufacturing an Ethernet MDI device according to claim 12, wherein disposing the circuit traces comprises disposing strip-line traces.

18. The method of manufacturing an Ethernet MDI device according to claim 11, further comprising:

disposing on the circuit board a power-ground metal region for connecting to a power source, the power-ground metal region being electrically separate from the cable-ground metal region and from the digital-ground metal region; and connecting the power-ground metal region to one or both of the cable-ground metal region and the digital-ground metal region using one or more inductors.

19. The method of manufacturing an Ethernet MDI device according to claim 11, wherein mounting the second capacitors is performed on a single surface of the circuit board.

20. The method of manufacturing an Ethernet MDI device according to claim 11, wherein mounting the second capacitors is performed on both surfaces of the circuit board.

* * * * *